(12) United States Patent
Kim et al.

(10) Patent No.: US 9,362,017 B2
(45) Date of Patent: Jun. 7, 2016

(54) PASTE COMPOSITION FOR FRONT ELECTRODE OF SOLAR CELL, AND SOLAR CELL INCLUDING THE SAME

(75) Inventors: Soon Gil Kim, Seoul (KR); Sang Gon Kim, Seoul (KR); Jun Phill Eom, Seoul (KR); Kyoung Hoon Chai, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 853 days.

(21) Appl. No.: 13/283,724

(22) Filed: Oct. 28, 2011

(65) Prior Publication Data

US 2012/0104332 A1    May 3, 2012

(30) Foreign Application Priority Data

Oct. 28, 2010  (KR) ................. 10-2010-0106329

(51) Int. Cl.
*H01B 1/20* (2006.01)
*H01L 31/0224* (2006.01)
*H01B 1/22* (2006.01)

(52) U.S. Cl.
CPC .. *H01B 1/22* (2013.01); *H01B 1/20* (2013.01); *H01L 31/022425* (2013.01); *H01L 31/0224* (2013.01)

(58) Field of Classification Search
CPC ..... H01B 1/20; H01B 1/22; H01L 31/022425
USPC .................. 252/514, 521.2; 136/252
See application file for complete search history.

(56) References Cited

U.S. PATENT DOCUMENTS

| | | | |
|---|---|---|---|
| 6,071,437 A * | 6/2000 | Oya ................. | 252/514 |
| 7,435,361 B2 | 10/2008 | Carroll et al. | |
| 7,556,748 B2 | 7/2009 | Wang et al. | |
| 8,231,934 B2 | 7/2012 | Takeda et al. | |
| 2002/0096663 A1 * | 7/2002 | Sato ................. | C03C 8/02 |
| | | | 252/500 |
| 2006/0001009 A1 * | 1/2006 | Garreau-Iles et al. ........ | 252/500 |
| 2008/0121850 A1 * | 5/2008 | Ahn et al. ................. | 252/520.3 |
| 2009/0298283 A1 | 12/2009 | Akimoto et al. | |
| 2010/0126565 A1 | 5/2010 | Takeda et al. | |
| 2010/0156290 A1 | 6/2010 | Kim et al. | |
| 2010/0258182 A1 * | 10/2010 | Akimoto ................. | H01B 1/16 |
| | | | 136/256 |

FOREIGN PATENT DOCUMENTS

| | | |
|---|---|---|
| CN | 1873836 A | 12/2006 |
| CN | 101055896 A | 10/2007 |
| CN | 101764011 A | 6/2010 |
| EP | 1713091 A2 | 10/2006 |
| EP | 1713092 A2 | 10/2006 |
| JP | 49038190 * | 4/1974 |
| JP | 63314801 A * | 12/1988 |
| KR | 10-2001-0111428 A | 12/2001 |
| KR | 10-2004-0044955 A | 5/2004 |
| KR | 10-2010-0005121 A | 1/2010 |
| TW | 201035260 A | 10/2010 |
| WO | WO-2009/146398 A1 | 12/2009 |
| WO | WO-2010/011429 A1 | 1/2010 |

OTHER PUBLICATIONS

Translation of JP 63314801, 2015.*
Office Action dated Sep. 11, 2013 in Chinese Application No. 201110333937.7, filed Oct. 28, 2011.
Office Action dated Feb. 27, 2012 in Korean Application No. 10-2010-0106329, filed Oct. 28, 2010.
European Search Report dated Feb. 22, 2012 in European Application No. 11186702.4, filed Oct. 26, 2011.

* cited by examiner

*Primary Examiner* — Khanh Tuan Nguyen
*Assistant Examiner* — Haidung Nguyen
(74) *Attorney, Agent, or Firm* — Saliwanchik, Lloyd & Eisenschenk

(57) ABSTRACT

Provided is a paste composition for front electrode of a solar cell. The paste composition includes conductive power, an organic vehicle, a glass frit, and an additive. The additive includes at least one material selected from the group consisting of Zn, Sb, V, W, Cr, Cd, Re, Sn, Mo, Mn, Ni, Co, Cu, and metal oxide including one of the foregoing materials.

13 Claims, 1 Drawing Sheet

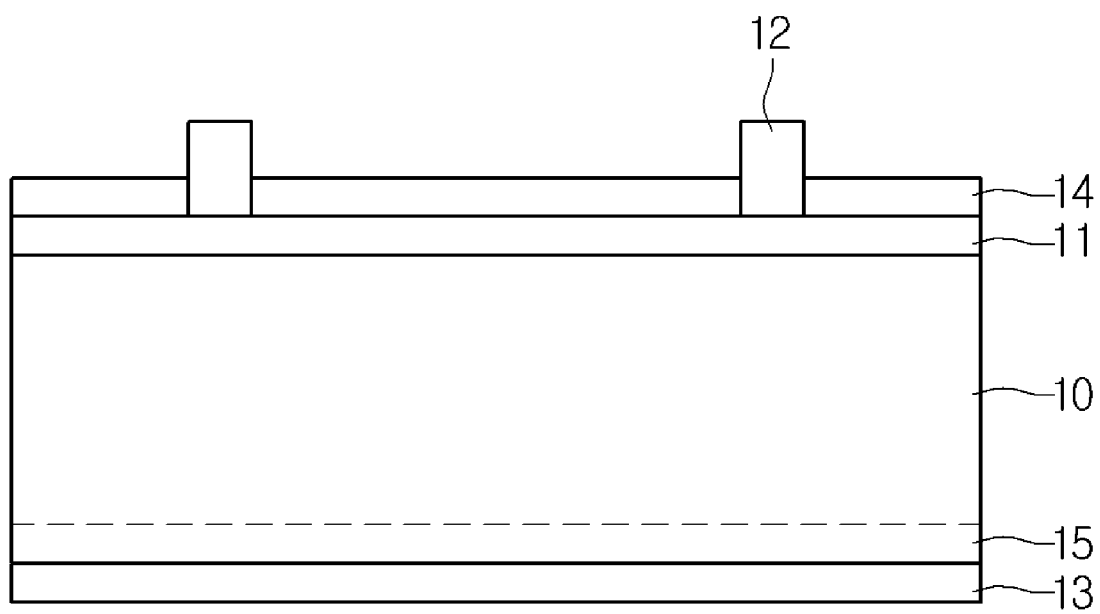

PASTE COMPOSITION FOR FRONT ELECTRODE OF SOLAR CELL, AND SOLAR CELL INCLUDING THE SAME

CROSS-REFERENCE TO RELATED APPLICATION

This application claims the benefit under 35 U.S.C. §119 of Korean Patent Application No. 10-2010-0106329, filed Oct. 28, 2010, which is hereby incorporated by reference in its entirety.

BACKGROUND

The present disclosure relates to a paste composition for front electrode of a solar cell, and a solar cell including the same.

Recently, it is becoming increasingly important to develop next-generation clean energy sources due to fossil energy exhaustion. Solar cells produce little pollution, utilize infinite resource and have a semi-permanent lifetime. Thus, it is expected that solar cells can serve as an energy source for solving future energy limitations.

Such a solar cell may include electrodes disposed on a silicon substrate including an N-type and P-type semiconductors. To improve electrical properties through improvement of adhesion between the electrodes and the silicon substrate, a Pb content within glass frit of paste compositions for solar cell should increase. However, since Pb may pollute the environment, the Pb content within the glass frit should decrease in consideration of environment. Thus, technologies which can maintain superior adhesion between the electrodes and the silicon substrate while reducing the Pb content are demanded.

BRIEF SUMMARY

Embodiments provide a paste composition for electrode of a solar cell, which reduces a Pb content and improves electrical properties and a solar cell including a front electrode formed of the paste composition.

In one embodiment, a paste composition for front electrode of a solar cell includes: conductive power; an organic vehicle; a glass frit; and an additive, wherein the additive includes at least one material selected from the group consisting of Zn, Sb, V, W, Cr, Cd, Re, Sn, Mo, Mn, Ni, Co, Cu, and metal oxide including one of the foregoing materials.

The metal oxide may include at least one material selected from the group consisting of $SnFe_2O_4$, $NiFe_2O_4$, $ZnFe_2O_4$, $CuFe_2O_4$, and $VFe_2O_4$.

The paste composition may include about 0.1% by weight to about 10% by weight of the additive. Here, the paste composition may include about 0.1% by weight to about 5% by weight of the additive, and more preferably, about 0.1% by weight to about 2% by weight of the additive.

The paste composition may include about 50% by weight to about 90% by weight of the conductive powder, about 10% by weight to about 50% by weight of the organic vehicle, about 1% by weight to about 20% by weight of the glass frit, and about 0.1% by weight to about 10% by weight of the additive. Preferably, the paste composition may include about 0.1% by weight to about 5% by weight of the additive, and more preferably, about 0.1% by weight to about 2% by weight of the additive.

The conductive powder may include silver (Ag) powder.

In another embodiment, a paste composition for front electrode of a solar cell includes: conductive power; an organic vehicle; a glass frit; and an additive comprising a metal different from that of the conductive powder, wherein the paste composition includes about 0.1% by weight to about 10% by weight of the additive.

The additive may include at least one material selected from the group consisting of Zn, Sb, V, W, Cr, Cd, Re, Sn, Mo, Mn, Ni, Co, Cu, and metal oxide including one of the foregoing materials.

The metal oxide may include at least one material selected from the group consisting of $SnFe_2O_4$, $NiFe_2O_4$, $ZnFe_2O_4$, $CuFe_2O_4$, and $VFe_2O_4$.

The paste composition may include about 0.1% by weight to about 5% by weight of the additive, and more preferably, about 0.1% by weight to about 2% by weight of the additive.

In further another embodiment, a solar cell including a front electrode manufactured using the paste composition for front electrode of the solar cell according to the embodiments.

The details of one or more embodiments are set forth in the accompanying drawings and the description below. Other features will be apparent from the description and drawings, and from the claims.

BRIEF DESCRIPTION OF THE DRAWINGS

FIG. 1 is a sectional view of a solar cell according to an embodiment.

DETAILED DESCRIPTION

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer (film), region, pattern, or structure may be modified for convenience in description and clarity. Also, the size of each element does not entirely reflect an actual size.

Hereinafter, a solar cell and a paste composition for front electrode (hereinafter, referred to as a "paste composition) used for forming a front electrode of the solar cell according to an embodiment will be described in detail.

An exemplary embodiment of a solar cell in which a paste composition according to an embodiment is applicable will be described with reference to FIG. 1. FIG. 1 is a sectional view of a solar cell according to an embodiment.

Referring to FIG. 1, a solar cell includes a P-type silicon substrate 10 including an N-type semiconductor part 11 on a front surface thereof, a front electrode 12 electrically connected to the N-type semiconductor part 11, and a back electrode 13 electrically connected to the P-type silicon substrate 10. An anti-reflection layer 14 may be disposed on a top surface of the N-type semiconductor except for the front electrode 12. A back surface field (BSF) layer may be disposed on the silicon substrate 10 including the back electrode 13.

The paste composition according to the current embodiment may be used for forming the front electrode 12 of the solar cell. That is, the paste composition may be coated on the silicon substrate 10, and then dried and burned to form the front electrode 12. For example, the paste composition may be dried for about 1 hour to about 30 minutes at a temperature of about 80° C. to about 200° C. Also, a rapid thermal process may be performed at a temperature of about 700° C. to about 900° C. to burn the paste composition.

The paste composition may include conductive powder, organic vehicle, glass frit, and additive.

Here, the conductive powder may be silver (Ag) powder. However, the present disclosure is not limited thereto. For example, various metal powders may be used as the conductive powder. The conductive powder may have a globular shape. However, the present disclosure is not limited thereto. For example, the conductive powder may include powder having a plate shape, a bell shape, or a flake shape.

The conductive powder may have a mean particle diameter of about 1 μm to about 10 μm. When the conductive powder has a mean particle diameter less than about 1 μm, a space in which organic matters are inserted between the conductive powders may be narrow. Thus, it may be difficult to disperse the organic matters. When the conductive power has a mean particle diameter greater than about 10 μm, a large number of pores are generated between the conductive powders to reduce density and increase resistance.

A single particle may be used as the conductive powder. Alternatively, particles having diameters or shapes different from each other may be mixed with each other, and thus the mixed particles may be used as the conductive powder.

The organic vehicle may be a solvent in which a binder is dissolved. Also, the organic vehicle may further include defoamer and dispersant. An organic solvent such as terpineol or carbitol may be used as the solvent. An acrylic-based resin, a cellulose-based resin, an alkyd-based resin may be used as the binder. However, the present disclosure is not limited thereto. For example, various organic vehicles may be used.

The organic vehicle may further include a thixotropic agent, a leveling agent, or a defoamer. A urea-based, amide-based, or urethane-based polymer/organic matter may be used as the thixotropic agent. Alternatively, an inorganic-based silica may be used as the thixotropic agent.

$PbO$—$SiO_2$-based, $PbO$—$SiO_2$—$B_2O_3$-based, $ZnO$—$SiO_2$-based, $ZnO$—$B_2O_3$—$SiO_2$-based, or $Bi_2O_3$—$B_2O_3$—$ZnO$—$SiO_2$-based frit may be used as the glass frit.

A metal additive including a metal such as Zn, Sb, V, W, Cr, Cd, Re, Sn, Mo, Mn, Ni, Co, or Cu except for Ag, or metal oxide including the metal may be used as the additive. $SnFe_2O_4$, $NiFe_2O_4$, $ZnFe_2O_4$, $CuFe_2O_4$, $VFe_2O_4$, $FeO.Fe_2O_3$, $MnO.Fe_2O_3$, $ZnO.Fe_2O_3$, or $NiO.Fe_2O_3$ may be used as the metal oxide.

The additive may include a metal that is bonded to the silicon substrate 10 (i.e., the N-type semiconductor part 11) constituting the solar cell at a lower temperature to form an alloy. The additive may enhance adhesion between the paste composition and the silicon substrate 10.

Also, the additive may include a metal that reacts with Ag contained as conductive powder to promote solid phase reaction. Also, the additive may promote grain growth of Ag powder that is the conductive powder at a low temperature. Thus, a burning temperature range of the paste composition may be expanded to improve conductivity.

Since the adhesion may be improved by the additive, the conductivity and efficiency may be maintained at a high level even though the Pb content contained in the glass frit decreases.

For example, the paste composition may include about 50% by weight to about 90% by weight of the conductive powder, about 10% by weight to about 50% by weight of the organic vehicle, about 1% by weight to about 20% by weight of the glass frit, and about 0.1% by weight to about 10% by weight of the additive.

When a content of the conductive powder exceeds about 90% by weight, it may be difficult to form the composition in a paste state. When a content of the conductive powder is less than about 50% by weight, the amount of conductive powder may be reduced to decrease conductivity of the manufactured front electrode 12.

When a content of the organic vehicle exceeds about 50% by weight, the manufactured front electrode 12 may decrease in conductivity. When a content of the organic vehicle is less than about 10% by weight, adhesion properties between the paste composition and the silicon substrate 10 may be deteriorated.

When a content of the glass frit ranges from about 1% by weight to about 20% by weight, adhesion, sintering behavior, and post-processing property may be improved.

When a content of the additive exceeds about 10% by weight, the amount of conductive powder may be reduced to increase a resistance of the front electrode 12 manufactured using the paste composition. Thus, efficiency of the solar cell may be reduced. When a content of the additive is less than about 0.1% by weight, it may be difficult to sufficiently except the effects due to the additive.

Here, the paste composition may contain about 0.1% by weight to about 5% by weight of the additive. In this case, the conductive powder may be sufficiently added to maintain high conductivity and also a high bonding force with a ribbon. To maximize the conductivity and the bonding force with the ribbon in a state where a Pb content is minimized, the paste composition may contain about 0.1% by weight to about 2% by weight of the additive.

The paste composition may be prepared through following processes.

A binder is dissolved into a solvent, and then a pre-mixing process is performed to form an organic vehicle. Then, conductive powder and an additive are added to the organic vehicle to age the mixture for about 1 hour to about 12 hours. Here, glass frit together with the conductive powder and the additive may be added. The aged mixture is mechanically mixed and dispersed through a 3 roll mill. The mixture is filtered and deaerated to prepare a paste composition. However, the forgoing process is only one example, and thus the present disclosure is not limited thereto.

A solar cell including a front electrode 12 manufactured using the paste composition may have superior adhesion between the front electrode 12 and a silicon substrate 10 to improve efficiency thereof. In addition, a Pb content may be reduced to minimize environmental pollution.

Hereinafter, the present disclosure will be described in detail with reference to embodiments. However, the following embodiments exemplify the present disclosure, and thus the present disclosure is not limited thereto.

Embodiment 1

A binder is dissolved into a solvent to prepare an organic vehicle. A mixed solvent of diethylene glycol monobutyl ether acetate and α-terpinenol may be used as the solvent. An ethyl cellulose-based binder may be used as the binder. Ag powder, glass frit, and an additive as conductive powder are added to the organic vehicle to mix the mixture. $SnFe_2O_4$ may be used as the additive. The resultant mixture is aged for about 12 hours and then secondarily mixed and dispersed using a 3 roll mill. Then, the mixture is filtered and deaerated to prepare a paste composition.

Here, the paste composition includes about 17% by weight of the organic vehicle, about 80% by weight of the Ag powder, about 2% by weight of the glass frit, and about 1% by weight of the additive.

A screen printing process is performed to coat the paste composition on a silicon substrate having a thickness of about 200 μm, and then the substrate including the paste composition is dried for about 2 minutes at a temperature of about 200° C. Then, a rapid thermal process is performed for about 30 seconds at a temperature of about 900° C. to manufacture a front electrode.

Embodiment 2

A front electrode is manufactured through the same process as that of Embodiment 1 except that a paste composition includes about 16% by weight of the organic vehicle, about 80% by weight of the Ag powder, about 2% by weight of the glass frit, and about 2% by weight of the additive.

Embodiment 3

A front electrode is manufactured through the same process as that of Embodiment 1 except that a paste composition includes about 13% by weight of the organic vehicle, about 80% by weight of the Ag powder, about 2% by weight of the glass frit, and about 5% by weight of the additive.

Embodiment 4

A front electrode is manufactured through the same process as that of Embodiment 1 except that a paste composition includes about 12% by weight of the organic vehicle, about 76% by weight of the Ag powder, about 2% by weight of the glass frit, and about 10% by weight of the additive.

Embodiment 5

A front electrode is manufactured through the same process as that of Embodiment 2 except that $NiFe_2O_4$ is used as an additive.

Embodiment 6

A front electrode is manufactured through the same process as that of Embodiment 2 except that $ZnFe_2O_4$ is used as an additive.

Embodiment 7

A front electrode is manufactured through the same process as that of Embodiment 2 except that $CuFe_2O_4$ is used as an additive.

Embodiment 8

A front electrode is manufactured through the same process as that of Embodiment 2 except that $VFe_2O_4$ is used as an additive.

Embodiment 9

A front electrode is manufactured through the same process as that of Embodiment 2 except that Zn is used as an additive.

Comparative Example 1

A front electrode is manufactured through the same process as that of Embodiment 1 except that a paste composition includes about 16% by weight of the organic vehicle, about 80% by weight of the Ag powder, and about 4% by weight of the glass frit without containing an additive.

Comparative Example 2

A front electrode is manufactured through the same process as that of Embodiment 1 except that a paste composition includes about 18% by weight of the organic vehicle, about 80% by weight of the Ag powder, and about 2% by weight of the glass frit without containing an additive.

Table 1 below shows the relative values obtained by measuring efficiency, fill factor, and bonding force of ribbon in a solar cell including the front electrode manufactured through Embodiments 1 to 9 and Comparative example 1 and 2 when values obtained in Comparative example 1 are defined as 100. The bonding force with the ribbon is obtained by measuring a bonding strength using a universal tester after a ribbon formed of Pb and Sn is soldered on the paste composition printed on the silicon substrate at a temperature of about 250° C. to about 300° C.

TABLE 1

|  | Efficiency | Fill factor | Bonding force |
| --- | --- | --- | --- |
| Embodiment 1 | 98 | 105 | 99 |
| Embodiment 2 | 101 | 100 | 103 |
| Embodiment 3 | 70 | 85 | 80 |
| Embodiment 4 | 50 | 60 | 60 |
| Embodiment 5 | 86 | 95 | 90 |
| Embodiment 6 | 85 | 98 | 95 |
| Embodiment 7 | 90 | 98 | 92 |
| Embodiment 8 | 88 | 95 | 91 |
| Embodiment 9 | 95 | 96 | 105 |
| Comparative example 1 | 100 | 100 | 100 |
| Comparative example 2 | 65 | 50 | 57 |

Referring to Table 1, it is seen that the efficiency, fill factor, and bonding force respectively decrease to about 65%, 50%, and 57% in Comparative example 2 containing about 2% by weight of the glass frit when compared to Comparative example 1 in which the paste composition contains about 4% by weight of the glass frit. That is, when the amount of glass frit, i.e., a Pb content is lowered without containing the additive, it is seen that the adhesion properties are significantly deteriorated. This is done because reaction between the silicon substrate and the paste composition is lowered due to a small amount of glass frit to cause schottky junction between the front electrode and the N-type semiconductor part. This is known from the low fill factor.

Referring to Embodiments 1 to 8, it is seen that the fill factor and bonding force are superior when compared to those of Comparative example 2 in which the paste composition contains the same amount of glass frit as those of Embodiments 1 to 8. According to Embodiments 1 to 8, it is seen that the paste composition and the silicon substrate ohmic-contact each other to realize superior fill factor.

According to Embodiments 1 to 3 and 5 to 8, although the paste composition contains about 2% by weight of the glass frit, it is seen that the efficiency and fill factor are similar to those of Comparative example 1. That is, when the paste composition contains about 5% by weight of the additive or less, the efficiency, fill factor, and bonding force may be maintained at a high level even though the amount of glass frit is reduced by half Specifically, Embodiment 2 in which the paste composition contains about 2% by weight of the $SnFe_2O_4$ as an additive may have superior efficiency, fill factor, and bonding force than those of Comparative example 1.

In the paste composition according to the embodiments, a material which can form a compound together with the metal constituting the conductive powder may be added to improve the adhesion even though the Pb content is reduced. The solar cell including the electrode manufactured using the paste composition has superior adhesion between the electrode and the silicon substrate to improve efficiency. Thus, the Pb content may be reduced to minimize the environmental pollution.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A paste composition for a front electrode of a solar cell, the paste composition comprising: a conductive powder; an organic vehicle; a glass frit; and an additive;
    wherein the additive comprises $ZnFe_2O_4$ or $SnFe_2O_4$.

2. The paste composition according to claim 1, wherein the paste composition comprises about 0.1% by weight to about 10% by weight of the additive.

3. The paste composition according to claim 2, wherein the paste composition comprises about 0.1% by weight to about 5% by weight of the additive.

4. The paste composition according to claim 2, wherein the paste composition comprises about 0.1% by weight to about 2% by weight of the additive.

5. The paste composition according to claim 1, wherein the paste composition comprises about 50% by weight to about 90% by weight of the conductive powder, about 10% by weight to about 50% by weight of the organic vehicle, about 1% by weight to about 20% by weight of the glass frit, and about 0.1% by weight to about 10% by weight of the additive.

6. The paste composition according to claim 1, wherein the paste composition comprises about 50% by weight to about 90% by weight of the conductive powder, about 10% by weight to about 50% by weight of the organic vehicle, about 1% by weight to about 20% by weight of the glass frit, and about 0.1% by weight to about 5% by weight of the additive.

7. The paste composition according to claim 1, wherein the paste composition comprises about 50% by weight to about 90% by weight of the conductive powder, about 10% by weight to about 50% by weight of the organic vehicle, about 1% by weight to about 20% by weight of the glass frit, and about 0.1% by weight to about 2% by weight of the additive.

8. The paste composition according to claim 1, wherein the conductive powder comprises silver (Ag) powder.

9. A solar cell comprising a front electrode manufactured using the paste composition for front electrode of the solar cell according to claim 1.

10. A paste composition for a front electrode of a solar cell, the paste composition comprising: a conductive powder; an organic vehicle; a glass frit; and an additive comprising a metal different from that of the conductive powder,
    wherein the paste composition is connected to a semiconductor part of the solar cell,
    wherein the paste composition comprises about 0.1% by weight to about 10% by weight of the additive, and
    wherein the additive comprises $ZnFe_2O_4$ or $SnFe_2O_4$.

11. The paste composition according to claim 10, wherein the paste composition comprises about 0.1% by weight to about 5% by weight of the additive.

12. The paste composition according to claim 11, wherein the paste composition comprises about 0.1% by weight to about 2% by weight of the additive.

13. The paste composition according to claim 10, wherein the semiconductor part of the solar cell is an N-type semiconductor part.

* * * * *